United States Patent [19]

Steckler et al.

[11] 4,364,026

[45] Dec. 14, 1982

[54] DIGITAL-TO-ANALOG CONVERTER USEFUL IN A TELEVISION RECEIVER

[75] Inventors: Steven A. Steckler, Clark; Alvin R. Balaban, Lebanon, both of N.J.

[73] Assignee: RCA Corporation, New York, N.Y.

[21] Appl. No.: 98,925

[22] Filed: Nov. 30, 1979

[51] Int. Cl.$^3$ .......................................... H03K 13/02
[52] U.S. Cl. ...................... 340/347 DA; 235/92 TF; 328/111; 340/347 M; 455/179
[58] Field of Search .................. 340/347 M, 347 DA; 328/111; 455/179; 235/92 TF

[56] References Cited

U.S. PATENT DOCUMENTS

| | | | |
|---|---|---|---|
| 3,603,977 | 9/1971 | Szabo | 340/347 M X |
| 3,754,233 | 8/1973 | Sutherland | 340/347 DA |
| 4,058,772 | 11/1977 | Mogi et al. | 340/347 DA X |
| 4,087,813 | 5/1978 | Minner et al. | 235/92 TF X |
| 4,095,218 | 6/1978 | Crouse | 328/111 X |

FOREIGN PATENT DOCUMENTS 2548762  5/1977  Fed. Rep. of Germany.
2638816 10/1977  Fed. Rep. of Germany.

OTHER PUBLICATIONS

"Digital Automatic Searcher" by Max Hegendorfer, *Funktechnik*, 1977, No. 11, appearing in pp. 183-185.
Matsu-ura et al., Low-Cost Digital Tuning System with Full-Function . . . , *IEEE Transactions on Consumer Electronics*, vol. CE-24, No. 4, 11/78, pp. 545-551.
Dreiske et al., Using a One-Chip Microprocessor for TV Tuning and . . . , *IEEE Transactions on Consumer Electronics*, vol. CE-24, No. 1, 2/78, pp. 47-55.

*Primary Examiner*—Thomas J. Sloyan
*Attorney, Agent, or Firm*—P. J. Rasmussen; P. M. Emanuel

[57] ABSTRACT

A digital-to-analog converter for use in a television tuning system to convert bits stored in a register to a corresponding tuning voltage includes a counter for generating binary pulse signals having pulses with durations proportional to powers of 2 and a plurality of selection gates for selecting ones of the binary pulse signals in accordance with the states of respective bits stored in the register to generate a plurality of output pulse signals each having G pulses with durations proportional to $$\frac{2^{n-1}}{G},$$

where n is the number of the respective bit. The output pulse signals are justified with respect to each other by position-determining gates and combined to form G clusters of contiguous but non-overlapping pulses. The resulting pulse signal is filtered by a low/pass filter to derive the tuning voltage. G is selected as a compromise value consistent with both reasonable temperature stability and a reasonably fast filter response.

6 Claims, 4 Drawing Figures

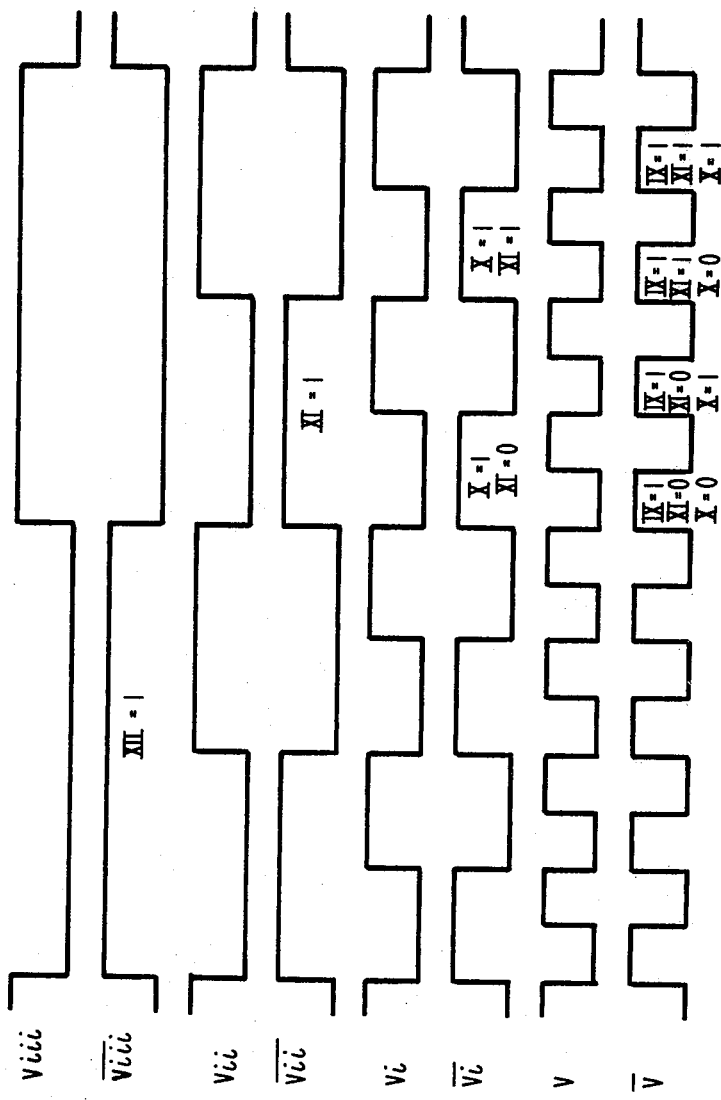

4,364,026

DIGITAL-TO-ANALOG CONVERTER USEFUL IN A TELEVISION RECEIVER

BACKGROUND OF THE INVENTION

The present invention relates to the field of digital-to-analog converters which may be utilized in tuning systems for radio and television receivers.

Digital-to-analog converters are utilized to convert binary signals to corresponding analog signals. Such converters have wide application. For example, in an electronic tuning system for a radio or television receiver, a digital-to-analog converter may be employed to convert binary signals, which are read out from a memory when a respective channel is selected, to a corresponding tuning voltage for controlling a voltage controlled frequency selective device such as a varactor diode.

A wide variety of digital-to-analog converters are known for various applications. Tuning systems often employ either a binary rate multiplier or a pulse-width modulator type of digital-to-analog converter. Each of these types converts binary signals representing the magnitude of an analog voltage to a pulse signal which is filtered by a low pass filter to derive the analog signal. The pulse signal generated by a binary rate multiplier includes uniformly short duration pulses proportional in number to the magnitude of the analog signal. The pulse signal generated by the pulse-width modulator generally includes a single pulse having a duration proportional to the magnitude of the analog signal.

Since the pulse signals generated by binary rate multipliers include a relatively large number of relatively short duration pulses, they can be readily filtered by low pass filters having relatively high cut-off freqencies and corresponding relatively short response times. However, since the rising and falling transitions of semiconductor devices change in a non-compensating manner as a function of temperature, binary rate multipliers which generate pulse signals with a relatively large number of transitions (i.e., there are two transitions for each pulse) are not stable with respect to temperature. Pulse-width modulators are less susceptible to temperature variations than are binary rate multipliers since the pulse signals they generate include only a few, e.g., two, transitions. However, because of the relatively long duration of the pulses generated by pulse width modulators, the associated low pass filter must have a relatively low cut-off frequency. Accordingly, pulse-width modulators have relatively slow response times. In addition, because low pass filters with relatively low cut-off frequencies may require a relative large-value filter capacitor, pulse-width modulators do not lend themselves to complete incorporation in an integrated circuit.

Since temperature stability and filter considerations are both important in tuning systems, digital-to-analog converters which have the advantages but not the disadvantages of binary rate multipliers and pulse-width modulators are desired. In other words, a digital-to-analog converter for use in tuning systems, as well as other applications, is desired which generates a pulse signal having a compromise number of pulses somewhere between the relatively large number of pulses generated by a corresponding binary rate multiplier for ease of filtering and the relatively low number of pulses generated by a corresponding pulse-width modulator for temperature stability.

SUMMARY OF THE PRESENT INVENTION

The present invention concerns a digital-to-analog converter for converting N binary signals or bits (binary digits) representing in combination the magnitude of an analog signal such as a tuning control voltage to a pulse signal in general containing G clusters of packed or contiguous pulses so that, in general, there are 2G transitions per conversion cycle. Desirably, G is selected as a compromise between a relatively large number which is desirable for easing the filtering requirements of an associated low pass filter and a relatively small number which is desirable for improving the temperature stability of the converter.

Specifically, the present digital-to-analog converter includes a counter responsive to clock pulses of a clock signal for generating binary pulse signals having pulses with durations proportional to powers of 2 and a plurality of selection means each responsive to one of the bits for selecting one of binary pulse signals when the respective bit has a predetermined logic level (e.g., a logic "1" level) indicating the presence of the corresponding power of 2 in the combination representing the magnitude of the analog signal to derive a respective output pulse signal. At least some of the selection means select ones of the binary pulse signals having pulses with durations proportional to $$\frac{2^{n-1}}{G},$$

where n is an identifying number n of the respective bit between N and M, where $G=2^M$. Combining means combine the output pulse signals of all of the selection gate means to provide a combined output signal having, in general, G pulses for $2^N$ clock pulses. It is desirable that the digital-to-analog converter also include a plurality of position determining means each for generating a respective position determining signals to control the positions of the pulses of a respective output pulse signal with respect to the pulses of other output pulse signals. Specifically, with respect to the output pulse signals having G pulses, each position determining signal controls the position of the G pulses of the respective output pulse signal so that its G pulses are contiguous, but not coincident, with the G pulses of the output signals of other selection gate means which have G pulses in the combined output signal. The combined output pulse signal is applied to low-pass filter means to derive the analog signal.

BRIEF DESCRIPTION OF THE DRAWING

FIGS. 3a and 3b are graphical representations of waveforms useful in understanding the preferred implementation shown in FIG. 2.

DETAILED DESCRIPTION OF THE DRAWING

Figure 1:
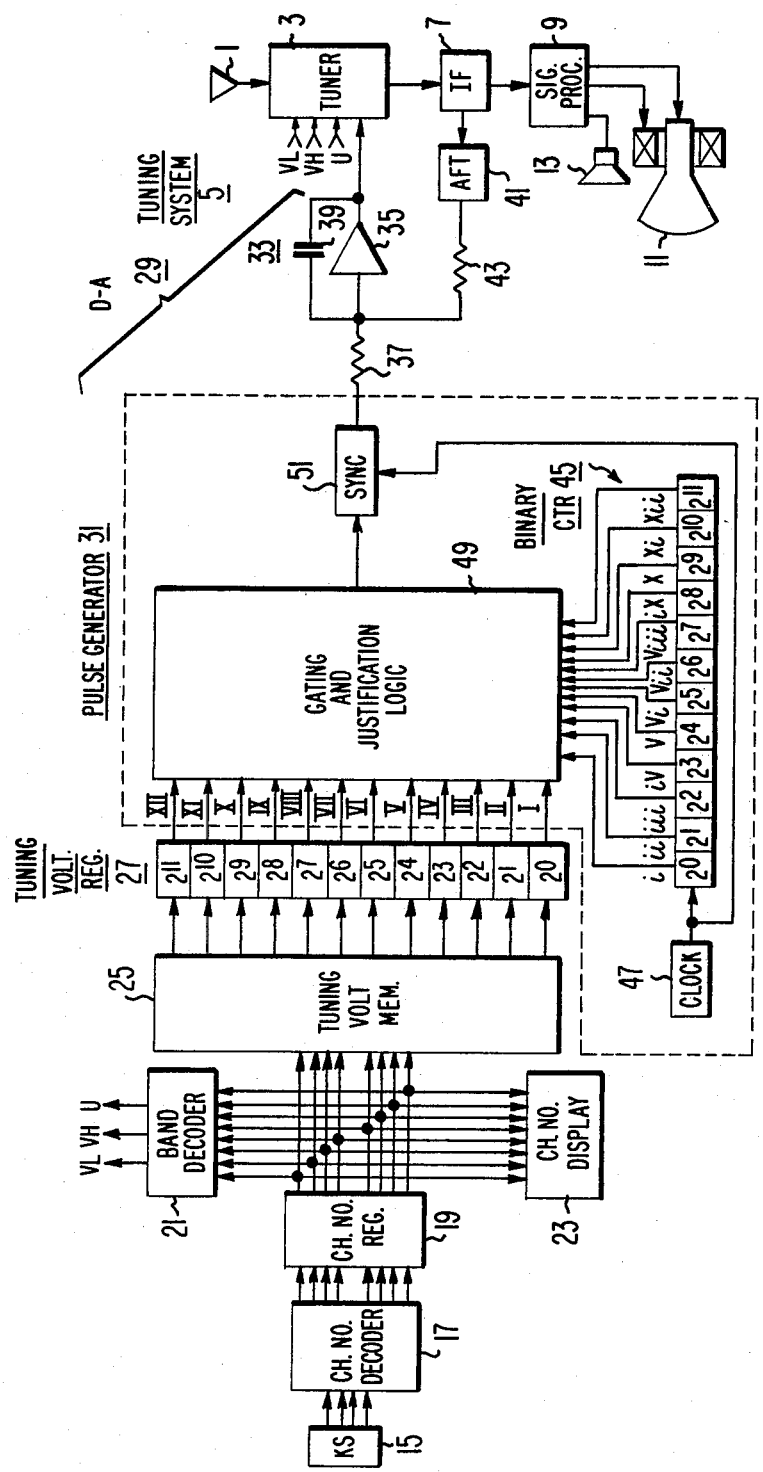
FIG. 1 is a schematic diagram, mostly in block form, showing a digital-to-analog converter constructed in accordance with the present invention as it may be employed in a tuning system for a television receiver.

The television receiver shown in FIG. 1 includes an RF signal source shown as antenna 1 for providing RF carriers in the television frequency range to a tuner 3.

Tuner 3 includes a frequency selective RF section (not shown) for selecting the RF carrier associated with a channel selected by a viewer in response to band selection signals and a tuning voltage generated by a tuning control system 5. Tuner 3 also includes a local oscillator (not shown) for generating a local oscillator signal having a frequency associated with the selected channel in response to the band selection signals and tuning voltage. The selected RF carrier and local oscillator signal are heterodyned by a mixer (not shown) within tuner 3 to derive an IF signal. The IF signal includes a picture carrier bearing video and synchronization information and a sound carrier bearing audio information. The IF signal is filtered and amplified by an IF unit 7. The various components of the IF signal are further processed by a signal processing unit to derive video and deflection signals for a kinescope 11 and an audio signal for a speaker 13.

The RF section and local oscillator of tuner 3 each include at least one tuned circuit. The tuned circuits each include a fixed inductor element and a voltage variable capacitor, e.g., a varactor diode. The inductor is selected in response to the band selection signals to determine the frequency range of tuned circuit. The value of the capacitor is controlled in accordance with the magnitude of the tuning voltage to determine the center frequency of the tuned circuit.

Tuning control system 5 includes a keyboard 15 having keys for each of the digits 0 through 9 by which channels may be selected. To select a channel, the two keys corresponding to the tens and units digits are sequentially operated in the order named. When a key is operated, keyboard 15 generates a group of four binary signals representing in a coded format, e.g., BCD (Binary Coded Decimal) the corresponding digit. A decoder 17 receives the sequentially generated BCD signals and applies them to the respective tens and units portions of a channel number register 19.

The contents of channel number register 19 are applied to a band decoder 21 which determines from the channel number the band in which the selected channel resides and generates the appropriate one of a VL band selection signal for channels 2–6, a VH band selection signal for channels 7–14, and a U band selection signal for channels 14–83. The contents of channel number register 19 are also applied to a display unit 23 for displaying the channel number of the selected channel. Finally, the contents of channel register 19 are applied to a tuning voltage memory 25.

Tuning voltage memory 25 includes a plurality of memory locations each for storing 12 binary signals representing the magnitude of the tuning voltage for a respective channel. Channel number register 19 is the address register for tuning voltage memory 25. When a channel is selected, the contents of the respective memory location of tuning voltage memory 25 are read out and stored in a tuning voltage register 27.

Tuning voltage register 27 includes 12 stages, each for storing a respective binary signal corresponding to a power of 2. The binary signals or bits (binary digits) are identified by Roman numerals I through XII. It will be noted that the power of 2 represented by each bit is one less than the respective identifying number. Bits I–XII represent in combination, in straight binary code, the magnitude of the tuning voltage. Each of the I–XII bits either has a logic high or "1" level or has a logic low or "0" level signifying the presence or absence, respectively, of the bit in the combination representing the magnitude of the tuning voltage.

The contents of tuning voltage register 27 are applied to a digital-to-analog (D-A) converter 29, which converts the contents of tuning voltage register 27 to the respective tuning voltage. At this point it should be noted that while other numbers of bits may be stored in tuning voltage memory 25, it has been found that 12 bits provide suitable resolution (i.e., $2^{12}=4096$ levels) for tuning the 82 channels between 2 and 83.

D-A converter 29 includes a pulse generator 31 for converting the contents of tuning voltage register 27 to a pulse signal including a series of pulses having an average value which is proportional to the magnitude of the tuning voltage for the selected channel. An active low-pass filter (LPF) 33, including an operational amplifier 35 and an R-C network (shown simply as a resistor 37 and capacitor 39) arranged in conventional fashion as an integrator, filters and amplifies the pulse signal to generate the tuning voltage.

For various reasons, including: conversion errors of D-A converter 29, component variations due to environmental conditions, e.g., temperature, and aging, and, in the case of master antenna and cable installations, frequency offsets of the selected RF carrier, the frequency of picture carrier of the IF signal may not be at its nominal value, e.g., in the U.S., 45.75 MHz. Accordingly, an AFT (Automatic Fine Tuning) discriminator 41 is provided to generate an AFT signal having a polarity and magnitude corresponding to the sense and magnitude, respectively, of the deviation of the IF picture carrier from 45.75 MHz. The AFT signal is applied to active LPF 33 through a resistor 43 to modify the tuning voltage to correct for any deviation of the IF picture carrier from 45.75 MHz.

The number of transitions or pulses (there are 2 transitions per pulse) in the pulse signal generated by pulse generator 31 affects the temperature stability of D-A converter 29 since changes in the rise and fall times associated with pulse signals produced by the semiconductor logic circuitry which comprises pulse generator 31 vary with temperature and, unfortunately, do not typically cancel or compensate for one another. Therefore, from the point of view of temperature stability, it is desirable to have as few transitions (pulses) as possible. However, to decrease the number of pulses while maintaining the same average level requires that the width of the pulses be increased. Unfortunately, a low-pass filter for filtering a pulse signal having pulses with relatively long durations requires a low pass filter with a relatively low cutoff frequency filter. This undesirably results in a relatively slow response and may require the use of a large filter capacitor which may hamper the total integration of D-A converter 29 in an integrated circuit. Thus, it is desirable to select the number of pulses produced by pulse generator 31 at a compromise value consistent with both reasonable temperature stability and reasonable response time.

In contrast to a binary rate multiplier, which produces as many as $2^N$ individual pulses per conversion cycle, where N is the number of bits to be converted, and a pulse width modulator which typically produces only 1 pulse per conversion cycle, pulse generator 31 is arranged to produce G groups or clusters of "packed" pulses per conversion cycle (except for certain situations described below). By "packed" it is meant that all the bits or pulses of one type in each cluster are contiguous, i.e., all the binary "1" and all the binary "0" bits in each cluster are contiguous. As a result, while the average level of the pulse signal generated by pulse generator 31 is the same as that for an equivalent number of individual bits, because the bits in each cluster are packed, there are in general only 2G transitions.

It has been found that for N=12 bits, G=16 pulses or 2G=32 transitions per complete conversion cycle of $2^N$ clock pulses produces a suitable compromise between temperature stability and filtering characteristics. Accordingly, pulse generator 31 is specifically arranged to produce (except for certain situations identified below) 16 clusters of packed pulses per each conversion cycle of $2^N$ clock pulses. It will be appreciated that for other numbers of bits other numbers of clusters may be appropriate.

Pulse generator 31 includes a 12-stage binary counter 45 responsive to clock pulses generated by a clock pulse generator 47 for generating 12 binary pulse signals identified by Roman numerals i through xii representing in combination in straight binary code the number of pulses received from clock pulse generator 47. Although not specifically shown for the sake of simplicity of drawing, the logic complements of binary pulse signals i-xii are also generated by binary counter 45. The logic complements of binary pulse signals i-xii are identified as i̅-x̅i̅i̅, respectively, in FIGS. 2, 3a and 3b. Each binary pulse signal includes pulses with durations proportional to a respective power of 2 (see FIGS. 3a and 3b). It is noted that the power of 2 represented by eacy binary pulse signal is one less than the respective identifying numbers.

A gating and justification logic unit 49 selects ones of binary pulse signals i-xii or their respective logic complements in accordance with the binary levels of the binary signals I-XII to form a pulse signal having, in general, except for the situations described below, 16 groups or clusters of packed pulses for each conversion sequence.

Since time delays may be introduced by the logic elements of gating and justification logic unit 49 which are not generally predictable or consistent, the transitions of the pulse signal generated by gating and justification logic 49 tend to jitter or oscillate back and forth in time. Such jitter, when integrated by low pass filter 33, may adversely manifest itself as variations in the magnitude of the tuning voltage. Accordingly, a synchronization unit 51 synchronizes the transitions of the pulse signal generated by gating and justification logic 49 with corresponding transitions in the clock signal generated by clock pulse generator 47 to inhibit the jitter.

Figure 2:
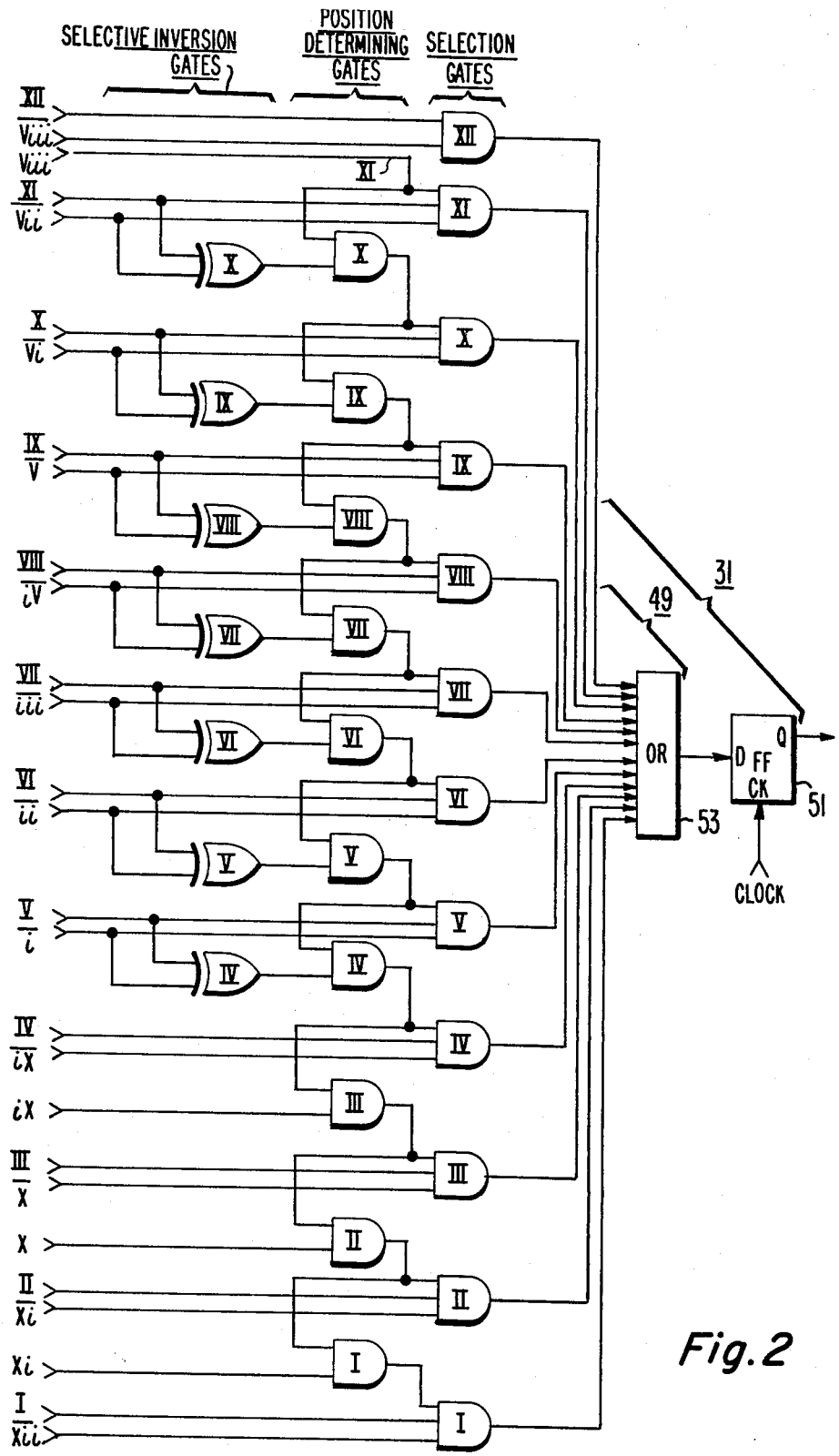
FIG. 2 is a logic diagram of a preferred implementation of a portion of the digital-to-analog converter shown in FIG. 1.

A preferred logic implementation of gating and justification logic unit 49 and synchronization unit 51 is shown in FIG. 2. The understanding of the logic circuitry shown in FIG. 2 will be facilitated by reference to FIGS. 3a and 3b.

The implementation of gating and justification unit 49 includes AND gates I-XII, collectively identified as "SELECTION GATES", responsive to bits I-XII, respectively, of tuning voltage register 27 for selecting ones of binary pulse signals or their logic complements to derive respective output pulse signals to be applied to an OR circuit 53. OR circuit 53 combines the individual pulse output signals applied to it in logic OR fashion to generate a combined pulse signal. Since OR circuit 53 has 12 inputs, it may in practice include a number of individual cascaded OR gates (not shown). The combined pulse signal is applied to synchronization unit 51 which, as shown, simply comprises a data (D) type flip-flop having the combined pulse output signal of OR circuit 53 applied to its D input and the clock signal generated by clock pulse generator 47 applied to its clock (CK) input. The Q output of D flip-flop 51 is taken as the output signal of pulse generator 31 and applied to low-pass filter 33. D flip-flop 51 not only synchronizes the pulse output signal of pulse generator 31 with the clock signal but also ensures that the pulse of the output signal switches substantially between the power supply limits independent of the number of logic "1's" and logic "0's" applied to the input of OR circuit 53.

AND gates XII-I collectively identified as "SELECTION GATES" determine the number of binary "1" and binary "0" bits in the respective output pulse signals and therefore in the combined pulse signal by selecting the binary pulse signals of binary counter 45 in accordance with the levels of the respectively numbered bits stored in tuning voltage register 27. A conductor XI and AND gates X-I collectively identified as "POSITION DETERMINING GATES" derive position determining signals for determining the position or justifying each of the output pulse signals generated by selection gates XII-I with respect to the output pulse signals generated by the higher order ones of selection gates XII-I so that, wherever possible, the clusters of each output signal are packed with like (i.e., all "1's" or "0's") clusters of the other output pulse signals. EXCLUSIVE-OR gates X-IV collectively identified as "SELECTIVE INVERSION GATES" co-operate with respectively numbered position determining gates in the pulse positioning or justification function as will be explained below.

As earlier noted, in general, there are G clusters of packed pulses in the combined output pulse signal. Therefore, it is desirable that each output pulse signal include G clusters of $$\frac{2^{n-1}}{G}$$

pulses or bits, where n is the number between XII and I of the bit stored in tuning voltage register 27. However, this is not possible where $2^{n-1}$ is less than G. Therefore, if G equals $2^M$, only those selection gates identified by Roman numerals equivalent to numbers greater than or equal to M+1 will generate G clusters and those selection gates identified by Roman numerals equivalent to numbers less than or equal to M will generate less than G clusters. For the specific case of G=16, only selection gates numbered between XII and V will produce 16 clusters and the selection gates numbered between IV and I will generate less than 16 clusters. Further, the combined output pulse signal will only contain less than 16 clusters when the bits V-XII stored in tuning voltage register 27 represent a number less than 16 or greater than 4095-16.

The operation of selection gates XII through V and respective ones of the position determining gates and selective inversion gates will be described by way of example with reference to selection gates XII through IX and the respective ones of the position determining and selective inversion gates. For this description particular attention is directed to FIG. 3a.

When the most significant bit, XII, of tuning voltage register 27 is a "1", the output pulse signal must contain at least $2^{12-1}=2048$ "1" bits. Since 16 clusters of "1" bits are desired, each cluster must include $$\frac{2048}{16} = 128$$

"1" bits. Since either viii or $\overline{\text{viii}}$ corresponds to $2^7=128$ clock pulses, either viii or $\overline{\text{viii}}$ can be selected when bit XII is at a "1". In the implementation, $\overline{\text{viii}}$ is selected by selection AND gate XII when bit XII is a "1".

When the next least significant bit, XI, of tuning voltage register 27 is a "1", at least $$\frac{2^{10}}{16} = \frac{1024}{16} = 64$$

"1" bits must be included in each of the 16 clusters. Since $\overline{\text{vii}}$ corresponds to $2^6=64$ clock pulses, $\overline{\text{vii}}$ is selected by selection AND gate XI when bit XI is a "1". In addition, if bit XII is also a "1", the 64 "1" bits corresponding to bit XI="1" must be packed with or contiguous with the 128 "1" bits corresponding to bit XII="1". Furthermore, they cannot occur in any portion of the time interval in which $\overline{\text{viii}}$ is a "1", (i.e., the time interval in which the 128 "1" bits corresponding to XII="1" occur) so that none of the 64 "1" bits corresponding to bit XI="1" will be lost. Accordingly, selection AND gate XI is responsive to vii applied to it as a position determining signal simply via a conductor identified by Roman numeral XI to justify or shift the 64 "1" bits corresponding to XI="1" so that they are contiguous with but not coincident with the 128 "1" bits corresponding to bit XII="1".

When the next least significant bit, X, of tuning voltage register 27 is a "1", at least $$\frac{2^9}{16} = \frac{512}{16} = 32$$

"1" bits must be included in each of the 16 clusters. Since $\overline{\text{vi}}$ corresponds to $2^5=32$ clock pulses, $\overline{\text{vi}}$ is selected by selection AND gate X when bit X is a "1". In addition, if bit XII is also a "1", the 32 "1" bits corresponding to X="1" cannot occur in any portion of the time interval when $\overline{\text{viii}}$ is a "1" (i.e., the time interval in which the 128 "1" bits corresponding to XII="1" occur). Accordingly, viii is applied to one input of position determining AND gate X. The output signal of position determining AND gate X is applied to an input of selection AND gate X to justify or shift the 32 "1" bits corresponding to bit X="1" so that they are not coincident with the 128 "1" bits corresponding to bit XII="1".

The position of the 32 "1" bits corresponding to bit X="1" relative to the 128 "1" bits corresponding to XII="1" depends on whether bit XI is a "1" or "0". If XI is a "0", the 32 "1" bits corresponding to X="1" must be packed next to or contiguous with the 128 "1" bits corresponding to XII="1" (see FIG. 3a, the portion of waveform vi labelled X=1, XI=0). If XI is a "1", the 32 "1" bits corresponding to bit X="1" must be packed next to or contiguous with the 64 "1" (see FIG. 3a, the portion of waveform vi labelled X=1, XI=1) bits corresponding to bit XI="1". To position the 32 "1" bits corresponding to bit X="1" relative to the 128 "1" bits corresponding to bit XII="1", bit XI and binary pulse signal $\overline{\text{vii}}$ are applied to EXCLUSIVE OR gate X. An EXCLUSIVE OR gate is a logic gate which produces a "1" at its output when one, but only one, of any of its inputs is at a "1". EXCLUSIVE OR gate X applies vii position determining to AND gate X if bit XI is a "0" and $\overline{\text{vii}}$ position determining to AND gate X if bit XI is a "1" in the following manner. When XI is a "0", the output signal of EXCLUSIVE OR gate X will be a "1" whenever $\overline{\text{vii}}$ is a "1". Accordingly, $\overline{\text{vii}}$ is, in essence, passed through EXCLUSIVE OR gate X whenever XI is a "0". When bit XI is a "1", the output signal of EXCLUSIVE OR gate X will be a "1" whenever $\overline{\text{vii}}$ is a "0". Accordingly, $\overline{\text{vii}}$ is inverted by EXCLUSIVE OR gate X whenever XI is a "1".

When the next most significant bit, IX, of tuning voltage register 27 is a "1", the output pulse signal of pulse generator 31 must contain at least $2^{9-1}=2^8=256$ "1" bits. This means that each cluster must contain $$\frac{2^8}{16} = \frac{256}{16} = 16$$

"1" bits. Since $\overline{\text{v}}$ corresponds to $2^4=16$ clock pulses, v is selected by selection AND gate IX when bit IX is a "1". The G clusters of the output pulse signal of selection AND gate IX must be contiguous but not coincident with any of the respective G clusters generated by selection AND gates XII, XI, and X. Accordingly, the position-determining signal generated by position-determining AND gate X is applied to position-determining AND gate IX so that the G clusters of the output pulse signal of selection AND gate IX are contiguous but not coincident with the respective G clusters of the output pulse signals of selection AND gate XII depending on the level of bit XI. Further, the output signal of EXCLUSIVE OR gate IX, responsive to X and $\overline{\text{vi}}$ are applied to position-determining AND gate IX so that the G clusters of the output pulse signal of selection AND gate IX is contiguous with but not coincident with the respective G clusters of the output signal of selection AND gate XI depending on the level of bit X.

Since the functions of selection AND gates VIII through V are analogous to those of selection AND gates XII through IX and the respective position determining structure, the functions of selection AND gates VIII through V will not be described in detail. However, it is important to emphasize the general relationship of the position-determining structure to the selection structure. Namely, each selection AND gate is responsive to a position-determining signal derived from the one of the binary pulse signals associated with the immediately preceding higher order selection gate. Accordingly, the G pulses of the respective output pulse signal are contiguous but not coincident with the G pulses of the immediately preceding higher order output pulse signal. Furthermore, since the outputs of position-determining AND gates X through V are cascaded from conductor XI on, the G pulses of the output pulse signal of each of selection AND gates XI are contiguous but not coincident with the corresponding G pulses of all of the preceding higher order output pulse signals.

Figure 3B:
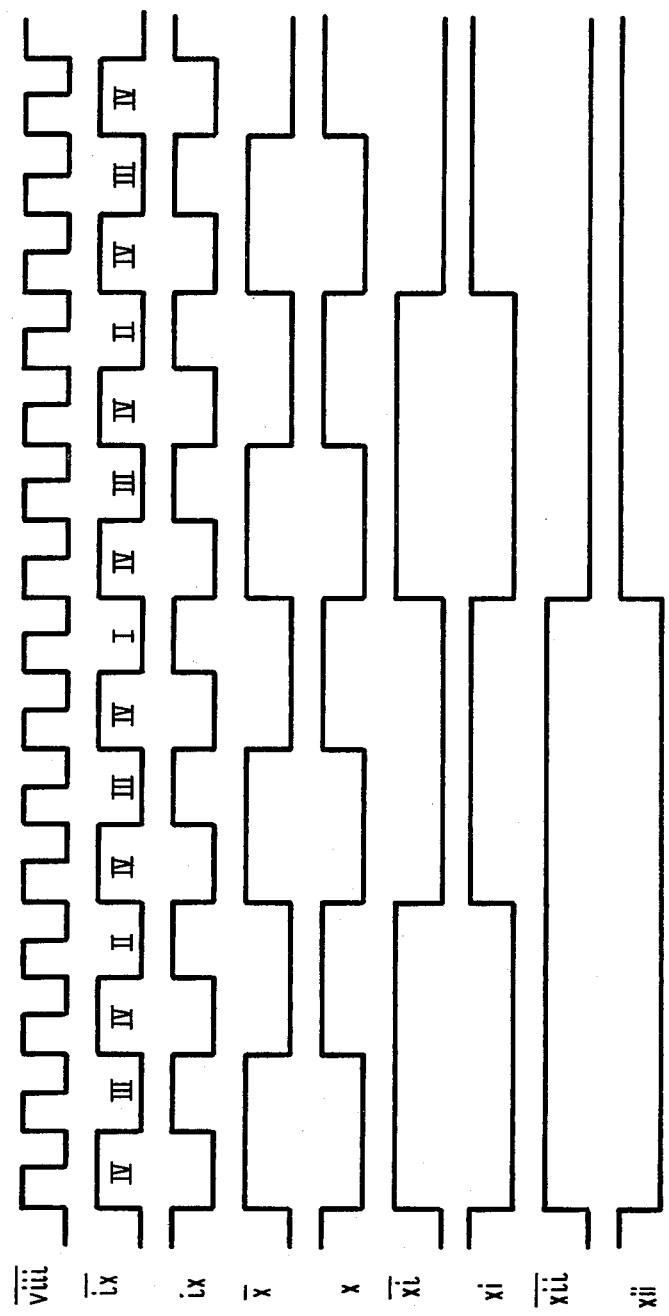

As earlier indicated, the selection gates identified by Roman numerals IV–I generate output pulse signals having less than 16 pulses during a conversion cycle. Reference to FIG. 3b should be made during the following description of the operation of selection gates IV–I and the associated position-determining structure.

Selection AND gates IV, III, II and I generate 8, 4, 2 and 1 output pulses, respectively, for each cycle of 16 output pulses generated by the remaining selection AND gates. Since $\overline{ix}$ occurs only ½ the number of times that $\overline{viii}$ occurs in a conversion cycle (i.e., 16 times), when bit IV is a "1", selection AND gate IV selects $\overline{ix}$. Since $\overline{x}$ occurs only ¼ the number of times that $\overline{viii}$ occurs, when bit III is a "1", selection AND gate selects $\overline{x}$. Since $\overline{xi}$ occurs only ⅛ the number of times that $\overline{viii}$ occurs, when bit II is a "1", selection AND gate II selects $\overline{xi}$. Since $\overline{xii}$ occurs only 1/16 the number of times that $\overline{viii}$ occurs, when bit I is a "1", selection AND gate I selects $\overline{xii}$. In general terms, selection AND gates numbered n equal to IV through I select the ones of the binary pulse signals corresponding to $2^{N-n}$, where N is the number of bits stored in tuning voltage register 27.

Position-determining AND gates IV through I generate position determining signals for respective ones of the output pulse signals of selection AND gates IV through I. Position-determining AND gates III through I are arranged in cascade to be successively responsive to higher order ones of binary pulse signals ix, x, and xi. As a result, the 4, 2, and 1 pulses of the respective output pulse signals are distributed among different ones of the 16 clusters of the output pulse signals of selection gates XII through V as indicated in FIG. 3b. This ensures that if the contents of tuning voltage register 27 correspond to a number less than 16 or greater than 4095-16, the number of pulses in the combined output pulse signal will not be packed so that there will be the highest number of pulses possible. This is important with respect to the response time of low pass filter 33 for the reasons set forth above.

Position-determining AND gate IV is responsive to the output signal of EXCLUSIVE OR gate IV, which is itself responsive to bit IV and pulse signal $\overline{ix}$, and to successively higher order ones of the position-determining signals by means of the cascading structure of position-determining AND gates X through V. This ensures that the individual pulses of the output pulse signals of selection gates IV through I are packed or contiguous with the cluster of pulses of the output pulse signals generated by the higher order selection gates XII through V with which they are associated. As a result there is a maximum number of 16 pulses or clusters per conversion cycle. This is important for the temperature stability of D-A converter 29 for the reasons set forth above.

While the cascaded position-determining structure has been emphasized with respect to the justification aspect of D-A converter 29, it is noted that it lends itself to incorporation in an integrated circuit since this type of cascaded arrangement reduces the number of conductor or metalization paths in an integrated circuit. A large number of conductor paths are not desired since this tends to limit the density (i.e., number of devices per unit area) of the integrated circuit.

While D-A converter 29 has been described in terms of OR, AND, and EXCLUSIVE-OR gates, it will be appreciated that other logic gates such as NOR and NAND gates may alternately be employed. These and other modifications are intended to be included within the scope of the present invention defined by the following claims.

What is claimed is:

1. In a system including register means for storing a plurality of N bits representing in combination the magnitude of an analog signal, each of said bits having a respective identifying number n between N and 1 and representing a respective power of 2 equal to $2^{n-1}$, each of said bits having either a first or a second level indicating the presence or absence, respectively, of said bit in the combination representing said magnitude, apparatus for converting the contents of said register means to a pulse signal having, in general, G pulses representing the magnitude of said analog signal, comprising:

clock means for generating clock pulses;

counter means for generating a plurality of binary pulse signals in response to said clock pulses, each of said binary pulse signals having pulses with durations proportional to a respective power of 2;

a plurality of N selection AND gate means each having an identifying number n between N and 1, each of said selection means being responsive to a respectively numbered bit and a respective predetermined one of said binary pulse signals for selecting pulses from the respective predetermined binary pulse signal to derive a respectively numbered output pulse signal when said respectively numbered bit has said first level;

each of said selection AND gate means which has an identifying number n between N and M+1, where M is a positive integer greater than zero and $2^M$ is equal to G, being responsive to the one of said binary pulse signals having pulses with durations corresponding to $$\frac{2^{n-1}}{G};$$

each of said selection AND gate means which has an identifying number n equal to or less than M being responsive to the one of said binary pulse signals having pulses with durations corresponding to $2^{N-n}$;

said selection AND gate means which has the identifying number N selecting all of the pulses of the respective predetermined binary pulse signal to derive the respectively numbered output pulse signal having G pulses when the respectively numbered bit has the first level;

a plurality of position determining means each having an identifying number between N−1 and 1, each of said position determining means generating a respectively numbered position determining pulse signal having pulses which occur substantially in coincidence with the time intervals not occupied by pulses of all the preceding higher numbered output pulse signals;

each of said selection AND gate means which has an identifying number between N−1 and 1 also being responsive to the respectively numbered position determining pulse signal for selecting those of the pulses of the respective predetermined binary pulse signal which are substantially coincident with the pulses of the respectively numbered position determining pulse signal to derive the respectively numbered output pulse signal when the respectively numbered bit has the first level so that each of said output pulse signals which has an identifying number between N−1 and M+1 having G pulses which are contiguous but not coincident with the respective G pulses of all the preceding higher numbered output pulse signals and each of said output pulse signals which has an identifying number equal to or less than M having less than G pulses which are distributed among and contiguous with different ones of the G pulses of the output pulse signals which have identifying numbers between N and M+1; and OR gate means for additively combining the pulses of said output pulse signals to generate said pulse signal representing the magnitude of the analog signal.

2. The apparatus recited in claim 1 wherein:

said position determining means which has the identifying number N−1 is responsive to the binary pulse signal to which the selection AND gate means which has the identifying number N is responsive for generating pulses which occur substantially in coincidence with the time intervals between the pulses of the binary pulse signal to which the selection AND gate means which has the identifying number N is responsive as the respectively numbered position determining pulse signal;

each of said position determining means which has an identifying number between N−2 and M includes a respectively numbered selective inversion means responsive to the immediately preceding higher numbered bit and the binary pulse signal to which the immediately preceding higher numbered selection AND gate means is responsive for generating pulses which occur substantially in coincidence with the time intervals between the pulses of the binary pulse signal to which the immediately preceding higher numbered selection means is responsive when the immediately preceding higher numbered bit has said second level and for generating pulses which occur substantially in coincidence with the time intervals between the pulses of the complement of the binary pulse signal to which the immediately preceding higher numbered selection AND means is responsive when the immediately preceding higher numbered bit has said first level;

each of said position determining means which has an identifying number between N−2 and M also includes a respectively numbered position determining AND gate means responsive to the pulses generated by the respectively numbered selective inversion means and the immediately preceding higher numbered position determining pulse signal for generating pulses which occur substantially in coincidence with the time intervals not occupied by pulses of all the preceding output pulse signals as the respectively numbered position determining pulse signal; and each of said position determining means which has an identifying number equal to or less than M−1 includes a respectively numbered position determining AND gate means responsive to the binary pulse signal to which the immediately preceding selection AND means is responsive and the immediately preceding position determining pulse signal for generating pulses which occur substantially in coincidence with the time intervals not occupied by pulses of all the preceding higher numbered output pulse signal as the respectively numbered position determining means.

3. The apparatus recited in claim 2 wherein:

said counter means generates two binary pulse signals having first and second opposite polarities for each power of 2, the binary pulse signal to which said selection AND gate means which has the identifying number N is responsive being of the second polarity, the binary pulse signals to which said selection AND gate means which have identifying numbers between N−1 and 1 are respectively responsive being of the first polarity, the binary pulse signal to which said position determining means which has the identifying number N−1 is responsive being of the first polarity, the binary pulse signals to which said position determining means which have identifying numbers between N−2 and 1 are respectively responsive being of the second polarity.

4. The apparatus recited in claim 3 wherein:

each of said selective inversion means is an EXCLUSIVE-OR gate.

5. The apparatus recited in claim 4 further including:

synchronization means for synchronizing the clock pulses of said clock signal with the pulses of said pulse signal generated by said combining means.

6. The apparatus recited in claim 5 wherein said synchronization means is a D type flip-flop.

* * * * *

UNITED STATES PATENT AND TRADEMARK OFFICE
CERTIFICATE OF CORRECTION

PATENT NO. : 4,364,026

DATED : December 14, 1982

INVENTOR(S) : Steven Alan Steckler et al.

It is certified that error appears in the above-identified patent and that said Letters Patent is hereby corrected as shown below:

Column 5, line 25, change "$\overline{\text{i-xii}}$" to -- i-xii --.

Column 5, line 26, change "i-xii" to -- $\overline{\text{I-xii}}$ --.

Column 8, line 3, change "$\overline{\text{vii}}$" to -- vii --.

Signed and Sealed this

Eighth Day of March 1983

[SEAL]

Attest:

Attesting Officer

GERALD J. MOSSINGHOFF

Commissioner of Patents and Trademarks